United States Patent [19]
McCollum et al.

[11] Patent Number: 5,373,169
[45] Date of Patent: Dec. 13, 1994

[54] LOW-TEMPERATURE PROCESS METAL-TO-METAL ANTIFUSE EMPLOYING SILICON LINK

[75] Inventors: John L. McCollum, Saratoga; Abdul R. Forouhi, San Jose, both of Calif.

[73] Assignee: Actel Corporation, Sunnyvale, Calif.

[21] Appl. No.: 992,055

[22] Filed: Dec. 17, 1992

[51] Int. Cl.$^5$ .................. H01L 27/02; H01L 29/46
[52] U.S. Cl. ............................... 257/50; 257/530
[58] Field of Search ............................ 257/50, 530

[56] References Cited

U.S. PATENT DOCUMENTS 5,070,384  12/1991  McCollum et al. ............ 257/530
5,166,556  11/1992  Hsu et al. ..................... 257/530

*Primary Examiner*—Robert Limanek
*Assistant Examiner*—David B. Hardy
*Attorney, Agent, or Firm*—D'Alessandro, Frazzini & Ritchie

[57] ABSTRACT

A metal-to-metal antifuse includes a lower electrode formed from a first metal layer in a semiconductor or other microcircuit structure. A barrier layer is disposed over the first metal layer. A first heavily-doped amorphous silicon layer is disposed over the barrier layer. A thin dielectric antifuse material is disposed over the first amorphous silicon layer. This dielectric can be nearly any dielectric such as nitride or oxide or a combination of these materials such as ONO and should have a breakdown voltage suitable for programming inside the integrated circuit. A second heavily-doped amorphous silicon layer is disposed over the dielectric layer. An upper electrode, comprising a second metal layer including an underlying barrier layer, is disposed over the second amorphous silicon layer. The first and second metal layers may comprise metal interconnect layers in the circuit structure.

12 Claims, 4 Drawing Sheets

LOW-TEMPERATURE PROCESS METAL-TO-METAL ANTIFUSE EMPLOYING SILICON LINK

BACKGROUND OF THE INVENTION

1. Field of the Invention

The present invention relates to antifuse technology. More particularly, the present invention relates to metal-to-metal antifuse structures which may be fabricated using low temperature fabrication processes.

2. The Prior Art

Prior art metal-to-metal antifuses all exhibit the phenomena of switching. When an already programmed antifuse passes a current having a magnitude comparable to the programming current, the antifuse can on occasion switch to an open state. This can create reliability problems in the circuit employing the antifuse as a connecting link. As a result of this problem, current circuit designs utilizing metal-to-metal antifuses employ very large programming currents in order to maintain a high ratio between the programming current and the normal operating current of the circuit. The necessity to utilize large programming currents requires the use of large-sized programming transistors which increase the size of the integrated circuit utilizing the metal-to-metal antifuses.

In addition, antifuse fabrication processes often employ high temperature processing steps. High temperatures above 550° C. are detrimental to aluminum interconnects used in standard integrated circuits.

It would therefore be advantageous to provide a metal-to-metal antifuse which may be fabricated by a process which avoids high temperature steps, and which can be reliably programmed and have a higher immunity to switching.

BRIEF DESCRIPTION OF THE INVENTION

According to the present invention, a first embodiment of a metal-to-metal antifuse includes a lower electrode formed from a first metal layer in a semiconductor or other microcircuit structure. A lower barrier layer is disposed over the first metal layer. A first heavily-doped amorphous silicon layer is disposed over the lower barrier layer. An inter-metal dielectric is disposed over the first heavily-doped amorphous silicon layer and an antifuse aperture is formed therein. A thin dielectric antifuse layer is disposed over the first amorphous silicon layer in the antifuse aperture. This dielectric antifuse layer can be nearly any dielectric such as nitride or oxide or a combination of these materials such as ONO and should have a breakdown voltage suitable for programming inside the integrated circuit. A second heavily-doped amorphous silicon layer is disposed over the dielectric antifuse layer. An upper electrode, comprising a second metal layer including an underlying upper barrier layer, is disposed over the second amorphous silicon layer. The first and second metal layers may comprise metal interconnect layers in the circuit structure.

A process for fabricating the first embodiment of the metal-to-metal antifuse of the present invention includes the steps of forming a first metal layer on a semiconductor or other microcircuit structure; forming a lower barrier layer over the first metal layer; forming a first heavily-doped amorphous silicon layer over the lower barrier layer; forming a thick insulating layer over the first heavily-doped amorphous silicon layer; forming an antifuse aperture in the thick insulating layer; forming a dielectric antifuse layer over the exposed first amorphous silicon layer in the antifuse aperture; forming a second heavily-doped amorphous silicon layer over the dielectric antifuse layer; forming an upper barrier layer over the second amorphous silicon layer; and forming a second metal layer over the upper barrier layer.

According to a second embodiment of the present invention, a metal-to-metal antifuse includes a lower electrode formed from a first metal layer in a semiconductor or other microcircuit structure. A lower barrier layer is disposed over the first metal layer. An inter-metal dielectric is disposed over the lower barrier layer and an antifuse aperture is formed therein. A first heavily-doped amorphous silicon layer is disposed over the lower barrier layer in the antifuse aperture. A thin dielectric antifuse layer is disposed over the first amorphous silicon layer in the antifuse aperture. This dielectric antifuse layer can be nearly any dielectric such as nitride or oxide or a combination of these materials such as ONO and should have a breakdown voltage suitable for programming inside the integrated circuit. A second heavily-doped amorphous silicon layer is disposed over the dielectric antifuse layer. An upper electrode, comprising a second metal layer including an underlying upper barrier layer, is disposed over the second amorphous silicon layer. The first and second metal layers may comprise metal interconnect layers in the circuit structure.

A process for fabricating the metal-to-metal antifuse of the second embodiment of the present invention includes the steps of forming a first metal layer on a semiconductor or other microcircuit structure; forming a lower barrier layer over the first metal layer; forming a thick insulating layer over the lower barrier layer; forming an antifuse aperture in the thick insulating layer; forming a first heavily-doped amorphous silicon layer over the exposed lower barrier layer in the antifuse aperture; forming a dielectric antifuse layer over the exposed first amorphous silicon layer in the antifuse aperture; forming a second heavily-doped amorphous silicon layer over the dielectric antifuse layer; forming an upper barrier layer over the second amorphous silicon layer; and forming a second metal layer over the upper barrier layer.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1A:
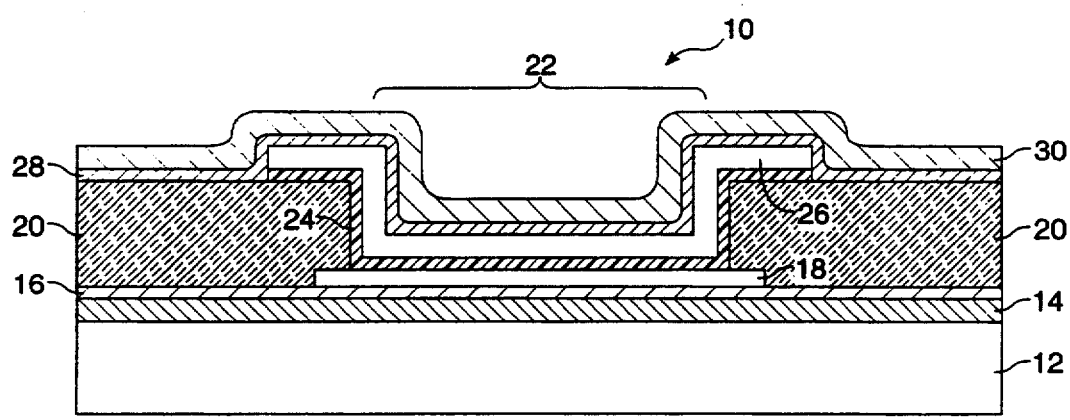
FIG. 1a is a cross-sectional view of an antifuse fabricated according to a first embodiment of the present invention.

Referring first to FIG. 1a a cross-sectional view is shown of an antifuse 10 fabricated according to the present invention. Antifuse 10 is fabricated on a substrate 12, which, as well understood by those of ordinary skill in the art, may be a partially completed semiconductor device, an insulating substrate, or the like.

A first electrode comprises a first metal layer 14, which may be formed from aluminum or any metal alloy compatible with integrated circuit fabrication. A lower barrier layer 16, such as TiW or TiW:N, is disposed over the first metal layer 14. The thickness of first metal layer 14 and lower barrier layer 16 may be 5,000 angstroms and 1,200 angstroms, respectively, but in fact may be selected from a wide range of thicknesses so long as they meet the criteria of reliable interconnect and barrier properties. In fact, the entire sandwich of layers 14 and 16 could be formed from a metal such as TiW or TiW:N which will not diffuse into the adjacent amorphous silicon layer 18 so as to disrupt its properties of smooth surface and a reliable structure that will not be come discontinuous under current flow.

The antifuse material of the antifuse of the present invention comprises a composite structure. A first amorphous silicon layer 18 forms the first layer of antifuse material and is disposed over barrier layer 16. An inter-metal dielectric layer 20 is disposed over the first amorphous silicon layer 18 and an antifuse aperture 22 is formed therein to expose the upper surface of the first amorphous silicon layer 18 using conventional processing technology. The thickness of the inter-metal dielectric layer 20 will contribute to the capacitance of the unprogrammed antifuse, and it is usually chosen to be about 3,000 to 10,000 angstroms in order to minimize that capacitance.

A dielectric antifuse layer 24, formed from a material such as a single layer of silicon dioxide or silicon nitride is shown in FIG. 1a. In alternate embodiments, illustrated in FIGS. 1b and 1c, a double or triple layer structure of combinations of silicon dioxide and silicon nitride shown in FIGS. 1b and 1c as layers 24a, 24b and 24c, may be employed. In each of the embodiments of FIGS. 1a-1c, the dielectric antifuse layer 24 may be formed to a total thickness of 200 angstroms, by low temperature techniques, such as PECVD techniques, is disposed in aperture 22 over first amorphous silicon layer 18. A second amorphous silicon layer 26 having a thickness of between about 100-2,000 angstroms is disposed over dielectric antifuse material layer 24.

According to a presently preferred embodiment of the invention, first and second amorphous silicon layers 18 and 26 may be heavily doped to a concentration of about $1 \times 10^{20}$ atoms/cm$^3$ with a species selected from the group including phosphorous, boron, arsenic, and antimony. Techniques for deposition of amorphous silicon include PECVD and LPCVD. Doping of the amorphous silicon can be done in-situ during the deposition process or by an ion implantation process performed after deposition as are known in the art. Together with dielectric antifuse material layer 24, first and second amorphous silicon layers 18 and 26 determine the programming voltage of the antifuse 10. Typical thicknesses for these layers, and the resulting programming voltages, are 500/200/500 angstroms and 14 volts.

Finally, an upper barrier layer 28 and second metal layer 30 comprise a first electrode. The upper barrier layer 28 and second metal layer 30 may be formed from aluminum with a lower barrier layer of TiW:N. Typically, the barrier layer is between about 300-3,000 angstroms, usually about 1,200 angstroms, and the metal or metal alloy portion of the layer is between about 3,000-10,000 angstroms, usually about 5,000 angstroms.

Figure 2A:
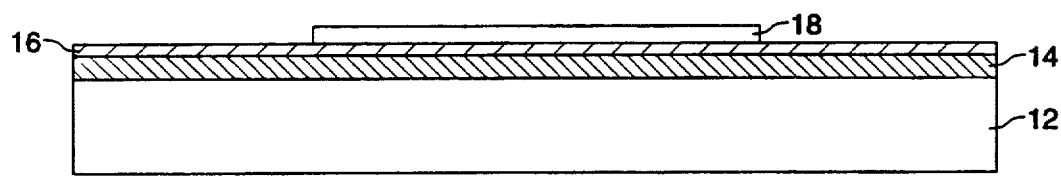
FIGS. 2a–2c are cross-sectional views of the antifuse of FIG. 1 taken at selected points during the fabrication process including a single layer antifuse dielectric layer.
Figure 2B:
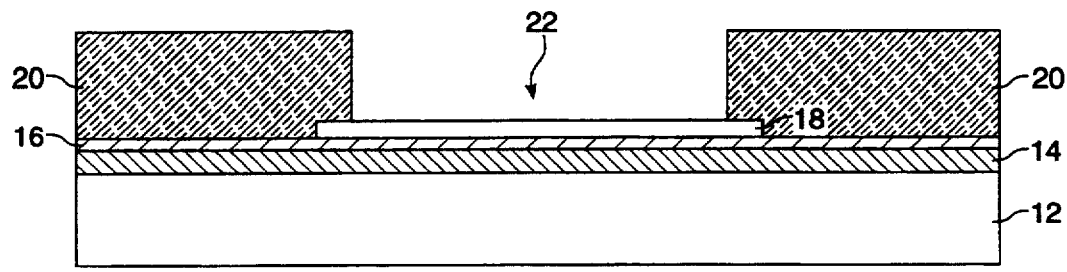
Figure 2C:
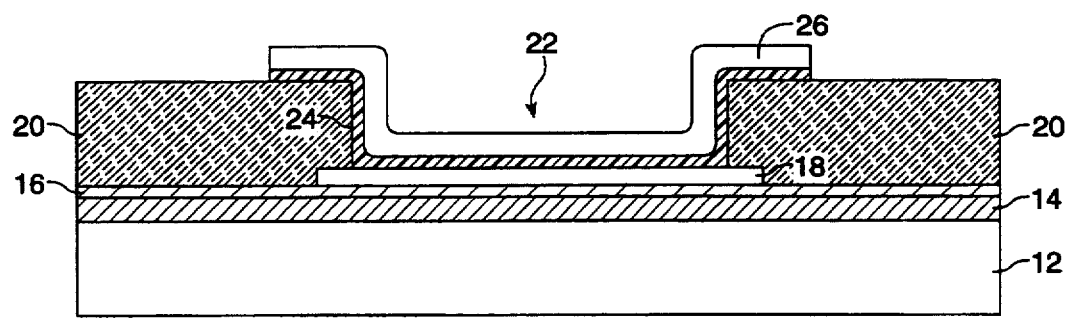

Referring now to FIGS. 2a-2c, cross-sectional views of the antifuse structure of FIG. 1a are shown after the performance of selected fabrication steps. FIG. 2a shows the structure resulting after formation of the first metal layer 14 and lower barrier layer 16 over substrate 12. First metal layer 14 and lower barrier layer 16 may be formed using conventional metalization technology. First amorphous silicon layer 18 has been formed and doped to a concentration of between about $1 \times 10^{18}$ and $1 \times 10^{20}$ atoms/cm$^3$ with a species selected from the group including phosphorous, boron, arsenic, and antimony. Techniques for deposition of amorphous silicon include PECVD and LPCVD. Doping of the amorphous silicon can be done in-situ during the deposition process or by an ion implantation process performed after deposition as are known in the art. First amorphous silicon layer 18 has been defined using conventional photolithographic and etching techniques.

Referring now to FIG. 2b, an inter-metal dielectric layer 20 has been formed from a material such as silicon dioxide using PECVD techniques, and conventional photolithographic and etching techniques have been employed to form antifuse aperture 22 therethrough to expose the upper surface of first amorphous silicon layer 18. Aperture 22 is sized according to design needs, and a typical aperture may be about 0.8 microns in size. Care must be taken to avoid over-etching the aperture 22 to prevent substantial etching of first amorphous silicon layer 18.

Figure 1B:
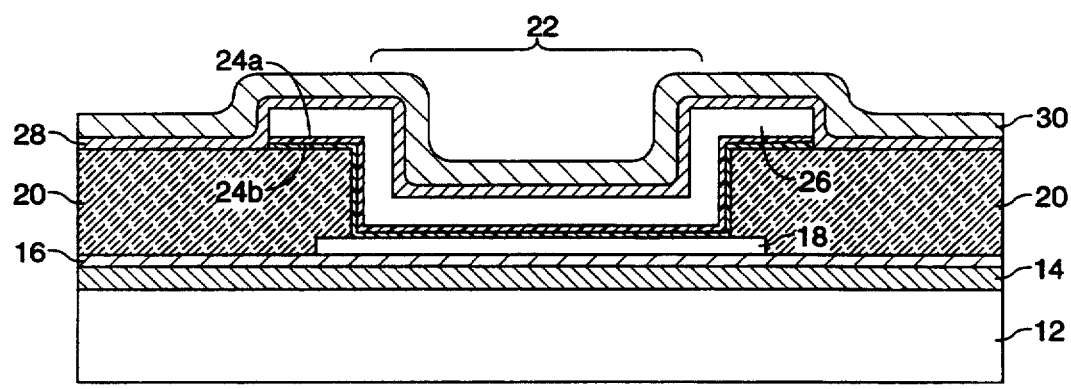
FIG. 1b is a cross-sectional view of an antifuse fabricated according to a first embodiment of the present invention, illustrating an embodiment including a double layer antifuse dielectric layer.
Figure 1C:
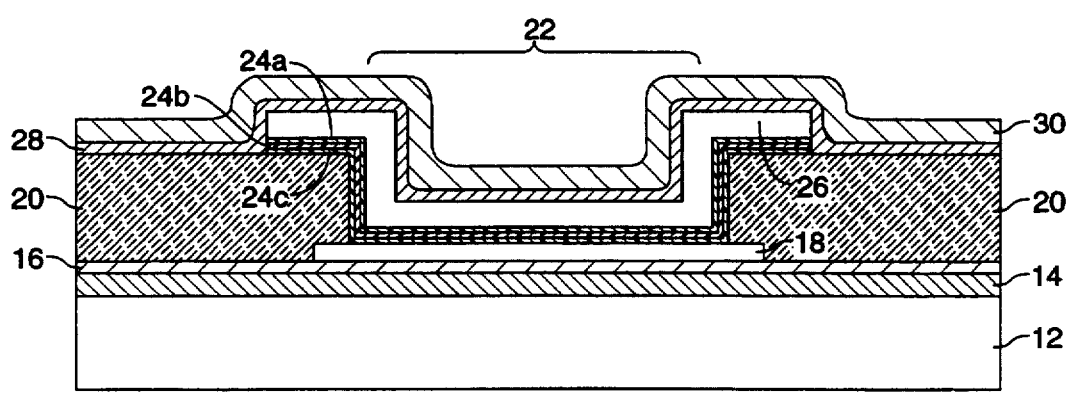
FIG. 1c is a cross-sectional view of an antifuse fabricated according to a first embodiment of the present invention including a triple layer antifuse dielectric layer.

Referring now to FIG. 2c, dielectric antifuse material layer 24, has been formed from a material such as silicon dioxide or silicon nitride formed to a thickness of 200 angstroms, by CVD techniques. Other materials suitable for antifuse material layer 24 include silicon nitride, silicon dioxide, oxide/nitride/oxide, nitride/oxide/nitride, oxide/nitride, and nitride/oxide sandwich layers as shown in FIGS. 1b and 1c. Second amorphous silicon layer 26 has been formed and doped to a concentration of between about $1 \times 10^{18}$ and $10^{20}$ atoms/cm$^3$ with a species selected from the group including phosphorous, boron, arsenic, and antimony. Techniques for deposition of amorphous silicon include PECVD and LPCVD. Doping of the amorphous silicon can be done in-situ during the deposition process or by an ion implantation process performed after deposition as are known in the art. The structure of FIG. 2c is shown after the stacked structure of dielectric antifuse material layer 24 and second amorphous silicon layer 26 have been defined using conventional photolithography and etching steps.

The antifuse structure is completed by forming the upper barrier layer 28 and second metal layer 30 using conventional metalization technology. The finished antifuse structure is shown in FIGS. 1a–1c, depending on the number of components of antifuse dielectric layer 24. Those of ordinary skill in the art will recognize that additional conventional steps may be performed to passivate and complete fabrication of the device containing the antifuse of the present invention.

Figure 3A:
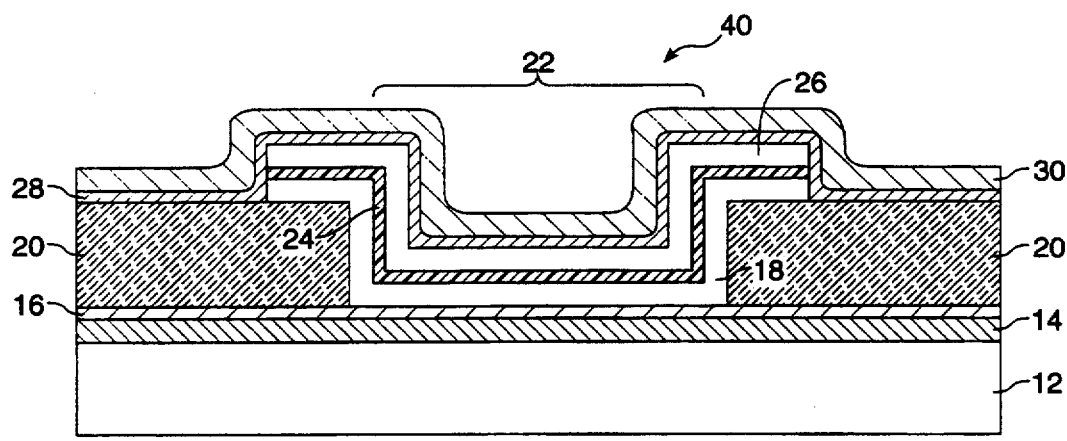
FIG. 3a is a cross-sectional view of an antifuse fabricated according to a second embodiment of the present invention.
Figure 3B:
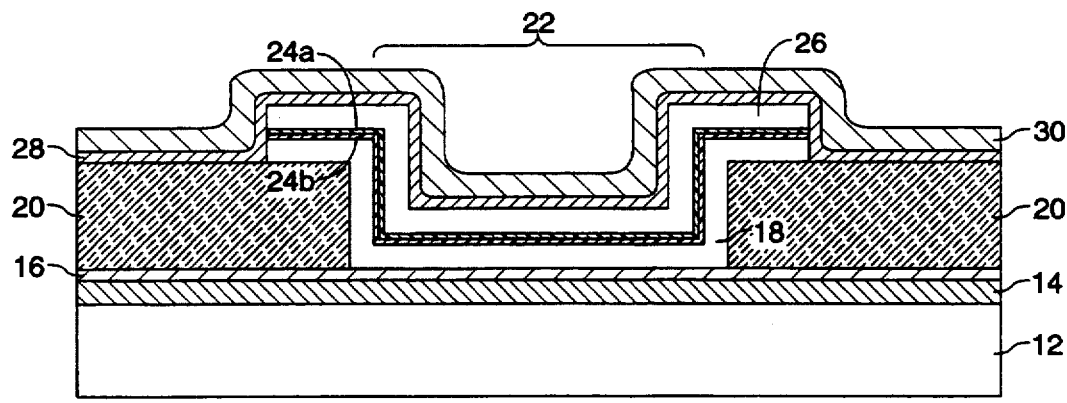
FIG. 3b is a cross-sectional view of an antifuse fabricated according to a first embodiment of the present invention, illustrating an embodiment including a double layer antifuse dielectric layer.
Figure 3C:
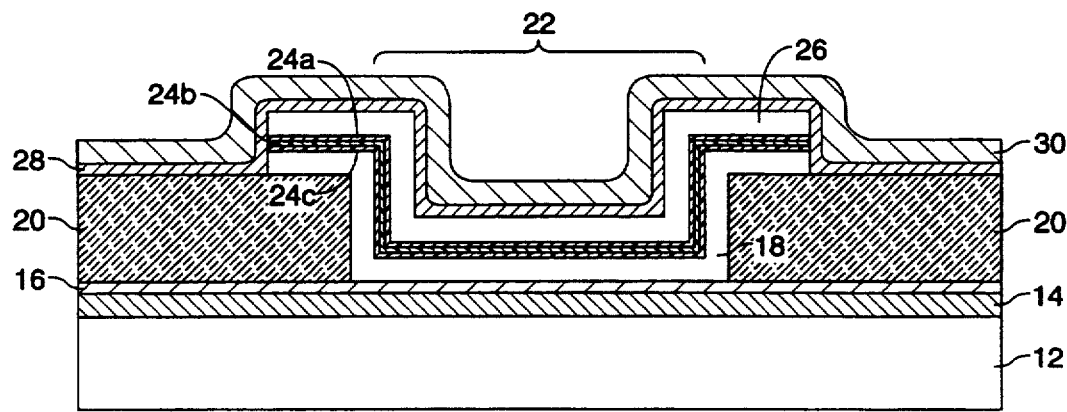
FIG. 3c is a cross-sectional view of an antifuse fabricated according to a first embodiment of the present invention including a triple layer antifuse dielectric layer.

Referring now to FIGS. 3a–3c, a second embodiment of the antifuse of the present invention is depicted in cross sectional view. As may be seen from an examination of FIGS. 3a–3c, the antifuse structure 40 depicted therein is similar to the antifuse structures 10 of FIGS. 1a–1c. The difference between the first and second embodiments of the antifuse of the present invention is that the inter-metal dielectric layer and antifuse aperture are formed first and the composite antifuse material is then formed in the antifuse aperture in the embodiment of FIGS. 3a–3c, whereas in the embodiment of FIGS. 1a–1c, the first amorphous silicon layer of the composite antifuse material layer is formed prior to the formation of the inter-metal dielectric layer. The dielectric layer and second amorphous silicon layer are then formed in the aperture over the exposed first amorphous silicon layer.

For ease of understanding of this disclosure, where the antifuse 40 of FIGS. 3a–3c includes the same elements as the antifuse 10 of FIG. 1, the same structures will be referred to by the same reference numerals used in FIGS. 1 and 2a–2c. Antifuse 40 of the second embodiment of the present invention is also formed on a substrate 12. A first metal layer 14 and lower barrier layer 16 form a lower electrode for antifuse 40. Typically, the barrier layer is between about 300–3,000 angstroms, usually about 1,200 angstroms, and the metal or metal alloy portion of the layer is between about 3,000–10,000 angstroms, usually about 5,000 angstroms.

An inter-metal dielectric layer 20 is disposed over the lower barrier layer 16, and an antifuse aperture 22 is formed therein to expose the upper surface of lower barrier layer 16. The antifuse material of the antifuse 40 of the second embodiment of the present invention comprises a first amorphous silicon layer 18, an intermediate antifuse dielectric layer 24, (shown as layers 24a, 24b, and 24c in FIGS. 3b and 3c) and a second amorphous silicon layer 26. Both amorphous silicon layers 18 and 26 are heavily in-situ doped with phosphorous, boron, arsenic, or antimony, and the intermediate antifuse dielectric layer 24 may also comprise the same materials as its counterpart in FIGS. 1a–1c.

The upper electrode of antifuse 40 comprises an upper barrier layer 28 and a second metal layer 30. These layers may have the same composition and thicknesses as their counterparts in the embodiment of FIGS. 1a–1c.

Figure 4A:
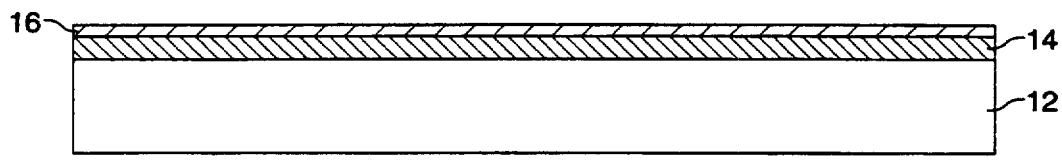
FIGS. 4a-4b are cross-sectional views of the antifuse of FIG. 3 taken at selected points during the fabrication process.
Figure 4B:
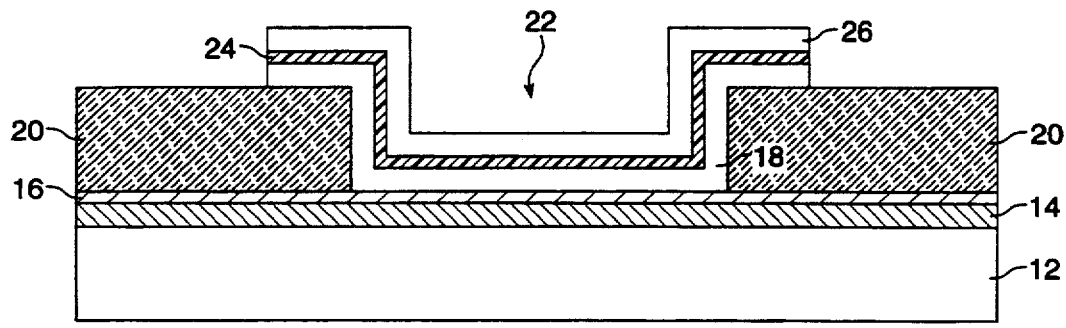

Referring now to FIGS. 4a–4b, cross-sectional views of the antifuse structure of FIGS. 3a–3c are shown after the performance of selected fabrication steps. FIG. 4a shows the structure resulting after formation of the first metal layer 14 and lower barrier layer 16 over substrate 12. First metal layer 14 and lower barrier layer 16 may be formed using conventional metalization technology.

In FIG. 4b, the structure is shown after formation of the inter-metal dielectric layer 20 and formation of the antifuse aperture 22 therein. First heavily-doped amorphous silicon layer 18 has been formed in antifuse aperture 22 and has been doped to a concentration of between about $1 \times 10^{18}$ and $10^{20}$ atoms/cm$^3$ with a species selected from the group including phosphorous, boron, arsenic, and antimony. Techniques for deposition of amorphous silicon include PECVD and LPCVD. Doping of the amorphous silicon can be done in-situ during the deposition process or by an ion implantation process performed after deposition as are known in the art. Dielectric antifuse material layer 24, has been formed from a material such as silicon dioxide or silicon nitride formed to a thickness of 200 angstroms, by CVD techniques. Other materials suitable for antifuse material layer 24 include silicon nitride, silicon dioxide, oxide/nitride/oxide, nitride/oxide/nitride. oxide/nitride, and nitride/oxide sandwich layers. Second heavily-doped amorphous silicon layer 26 has been formed over dielectric antifuse layer 24 and has been doped to a concentration of between about $1 \times 10^{18}$ and $1 \times 10^{20}$ atoms/cm$^3$ with a species selected from the group including phosphorous, boron, arsenic, and antimony. Techniques for deposition of amorphous silicon include PECVD and LPCVD. Doping of the amorphous silicon can be done in-situ during the deposition process or by an ion implantation process performed after deposition as are known in the art. The structure in FIG. 4b is shown after completion of the masking and etching step used to define the stacked structure comprising first and second amorphous silicon layers 18 and 26 and dielectric antifuse layer 24, after removal of the mask. Those of ordinary skill in the art will appreciate that this embodiment of the antifuse of the present invention employs a single masking step to define these layers.

FIGS. 3a–3c, depending on the composition of antifuse dielectric layer 24 shows the completed structure after upper barrier layer 28 and second metal layer 30 have been formed over the top of the structure depicted in FIG. 4b.

The first embodiment of the antifuse of the present invention is presently preferred because its capacitance will be less and will be dominated by capacitance per unit area of the antifuse dielectric multiplied by the area of the antifuse via. In contrast, the antifuse of the second embodiment of the present invention will have a capacitance equal to the capacitance per unit area of the dielectric multiplied by the area defined by the width of the amorphous silicon layers.

In addition, the aperture into which the intermediate dielectric layer will be deposited is the full area of the original aperture, whereas the antifuse of the second embodiment has a narrower depression in the center which gets narrower as the layer thicknesses increase and which thus may present problems in producing uniform dielectric thickness.

The antifuse of the second embodiment of the invention does have some advantages. The dielectric will be deposited on a smooth surface as deposited (since in-situ deposition is possible) as opposed to a surface that has seen a plasma etch and various cleaning steps. In addition, only one mask will be needed to define the sandwich comprising layers 18, 24, and 26, whereas the antifuse of the embodiment of FIGS. 1a–1c requires the use of two separate masks.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A metal-to-metal antifuse structure comprising:
   a lower electrode formed from a portion of a first metal layer and a lower barrier layer disposed over said first metal layer;
   a first heavily-doped amorphous silicon layer disposed over said lower barrier layer;
   an inter-metal dielectric layer disposed over said first heavily-doped amorphous silicon layer, said inter-metal dielectric layer having an antifuse aperture formed therein to expose a portion of an upper surface of said first heavily-doped amorphous silicon layer;
   a dielectric antifuse layer disposed over said portion of said upper surface of said first heavily-doped amorphous silicon layer;
   a second heavily-doped amorphous silicon layer disposed over said dielectric antifuse layer;
   an upper electrode formed from a portion of an upper barrier layer disposed over said second amorphous silicon layer and a second metal layer disposed over said upper barrier layer.

2. The metal-to-metal antifuse structure of claim 1 wherein the first and second metal layers comprise metal interconnect layers.

3. The metal-to-metal antifuse of claim 1 wherein said first and second amorphous silicon layers are doped with a species selected from the group consisting of phosphorous, boron, arsenic, and antimony to a concentration of between about $1 \times 10^{18}$ and about $10^{20}$ atoms/cm$^3$.

4. The metal-to-metal antifuse of claim 1 wherein said dielectric antifuse layer comprises a single layer of a material chosen from the group consisting of silicon dioxide and silicon nitride.

5. The metal-to-metal antifuse of claim 1 wherein said dielectric antifuse layer comprises a dual layer structure chosen from the group consisting of silicon dioxide/silicon nitride, and silicon nitride/silicon dioxide.

6. The metal-to-metal antifuse of claim 1 wherein said dielectric antifuse layer comprises a triple layer structure chosen from the group consisting of silicon dioxide/silicon nitride/silicon dioxide, and silicon nitride/silicon dioxide/silicon nitride.

7. A metal-to-metal antifuse structure comprising:
   a lower electrode formed from a portion of a first metal layer and a lower barrier layer disposed over said first metal layer;
   an inter-metal dielectric layer disposed over said lower barrier layer, said inter-metal dielectric layer having an antifuse aperture formed therein to expose a portion of an upper surface of said lower barrier layer;
   a first heavily-doped amorphous silicon layer disposed in said antifuse aperture over said portion of said upper surface of said lower barrier layer;
   a dielectric antifuse layer disposed over said portion of said first heavily-doped amorphous silicon layer;
   a second heavily-doped amorphous silicon layer disposed over said dielectric antifuse layer;
   an upper electrode formed from a portion of an upper barrier layer disposed over said second amorphous silicon layer and a second metal layer disposed over said upper barrier layer.

8. The metal-to-metal antifuse structure of claim 7 wherein the first and second metal layers comprise metal interconnect layers.

9. The metal-to-metal antifuse of claim 7 wherein said first and second amorphous silicon layers are doped with a species selected from the group consisting of phosphorous, boron, arsenic, and antimony to a concentration of between about $1 \times 10^{18}$ and about $10^{20}$ atoms/cm$^3$.

10. The metal-to-metal antifuse of claim 7 wherein said dielectric antifuse layer comprises a single layer of a material chosen from the group consisting of silicon dioxide and silicon nitride.

11. The metal-to-metal antifuse of claim 8 wherein said dielectric antifuse layer comprises a dual layer structure chosen from the group consisting of silicon dioxide/silicon nitride, and silicon nitride/silicon dioxide.

12. The metal-to-metal antifuse of claim 8 wherein said dielectric antifuse layer comprises a triple layer structure chosen from the group consisting of silicon dioxide/silicon nitride/silicon dioxide, and silicon nitride/silicon dioxide/silicon nitride.

* * * * *

UNITED STATES PATENT AND TRADEMARK OFFICE
CERTIFICATE OF CORRECTION

PATENT NO. : 5,373,169
DATED : December 13, 1994
INVENTOR(S) : John L. McCollum, Abdul R. Forouhi It is certified that error appears in the above-indentified patent and that said Letters Patent is hereby corrected as shown below:

Column 2, line 62, replace "FIG. 1" with --FIG. 1a--.
Column 3, line 8, replace "FIG. 3" with --FIG. 3a--.
Column 4, line 12, replace "voltages" with --voltage--.
Column 5, line 32, replace "FIG. 1" with --FIGS. 1a-1c--.
Column 5, line 34, replace "FIGS. 1" with --FIGS. 1a-1c--.
Column 5, line 54, replace "counterpart" with --counterparts--.
Column 6, line 63, replace "embodiment" with --embodiments--.

Signed and Sealed this

Eighteenth Day of June, 1996

Attest:

BRUCE LEHMAN

*Attesting Officer*   *Commissioner of Patents and Trademarks*